(12) United States Patent
Mukherjee et al.

(10) Patent No.: US 10,693,008 B2
(45) Date of Patent: Jun. 23, 2020

(54) CLADDING LAYER EPITAXY VIA TEMPLATE ENGINEERING FOR HETEROGENEOUS INTEGRATION ON SILICON

(71) Applicant: Intel Corporation, Santa Clara, CA (US)

(72) Inventors: Niloy Mukherjee, Portland, OR (US); Marko Radosavljevic, Portland, OR (US); Jack T. Kavalieros, Portland, OR (US); Ravi Pillarisetty, Portland, OR (US); Niti Goel, Portland, OR (US); Van H. Le, Portland, OR (US); Gilbert Dewey, Hillsboro, OR (US); Benjamin Chu-Kung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 14/914,906

(22) PCT Filed: Sep. 27, 2013

(86) PCT No.: PCT/US2013/062477
§ 371 (c)(1),
(2) Date: Feb. 26, 2016

(87) PCT Pub. No.: WO2015/047354
PCT Pub. Date: Apr. 2, 2015

(65) Prior Publication Data
US 2016/0204263 A1    Jul. 14, 2016

(51) Int. Cl.
*H01L 31/0256* (2006.01)
*H01L 29/78* (2006.01)
(Continued)

(52) U.S. Cl.
CPC .... *H01L 29/7853* (2013.01); *H01L 21/02381* (2013.01); *H01L 21/02428* (2013.01);
(Continued)

(58) Field of Classification Search
CPC ........... H01L 29/78696; H01L 29/0673; H01L 29/0688; H01L 29/42392; H01L 29/66431;
(Continued)

(56) References Cited

U.S. PATENT DOCUMENTS 5,461,250 A * 10/1995 Burghartz ......... H01L 29/66742
257/192
8,110,471 B2 * 2/2012 Lee ...................... B82Y 10/00
257/E29.127
(Continued)

FOREIGN PATENT DOCUMENTS

CN       1770470       5/2006
WO    WO 2013095343    6/2013
(Continued)

OTHER PUBLICATIONS

Lauhon, L., Gudiksen, M., Wang, D. et al. Epitaxial core-shell and core-multishell nanowire heterostructures. Nature 420, 57-61 (2002). https://doi.org/10.1038/nature01141 (Year: 2002).*

(Continued)

*Primary Examiner* — Jarrett J Stark
(74) *Attorney, Agent, or Firm* — Schwabe, Williamson & Wyatt, P.C.

(57) ABSTRACT

An apparatus including a semiconductor body including a channel region and junction regions disposed on opposite sides of the channel region, the semiconductor body including a first material including a first band gap; and a plurality of nanowires including a second material including a second band gap different than the first band gap, the plurality of
(Continued)

nanowires disposed in separate planes extending through the first material so that the first material surrounds each of the plurality of nanowires; and a gate stack disposed on the channel region. A method including forming a plurality of nanowires in separate planes above a substrate, each of the plurality of nanowires including a material including a first band gap; individually forming a cladding material around each of the plurality of nanowires, the cladding material including a second band gap; coalescing the cladding material; and disposing a gate stack on the cladding material.

10 Claims, 4 Drawing Sheets (51) Int. Cl.
*H01L 29/66* (2006.01)
*H01L 29/06* (2006.01)
*H01L 21/02* (2006.01)
*H01L 29/423* (2006.01)
*H01L 29/786* (2006.01)

(52) U.S. Cl.
CPC .... *H01L 21/02538* (2013.01); *H01L 29/0673* (2013.01); *H01L 29/0688* (2013.01); *H01L 29/42392* (2013.01); *H01L 29/66431* (2013.01); *H01L 29/66462* (2013.01); *H01L 29/66795* (2013.01); *H01L 29/78696* (2013.01)

(58) Field of Classification Search
CPC ......... H01L 29/66462; H01L 29/66795; H01L 21/02381; H01L 21/02428; H01L 21/02538; H01L 29/7851; H01L 29/78687; H01L 29/7853; H01L 2029/7858; H01L 29/0669–068; H01L 29/0665; H01L 29/66469; H01L 29/66439; H01L 2924/13061; H01L 29/7854; H01L 29/66803; H01L 29/66818; H01L 29/16–1608; H01L 29/22–2206; H01L 29/18–185; H01L 29/04–045; H01L 29/36–365; H01L 21/823431; H01L 21/823821; H01L 21/845; H01L 27/0886; H01L 27/0924; H01L 27/10826; H01L 27/10879; H01L 27/1211; Y10S 977/938
USPC ......................................................... 257/76
See application file for complete search history.

(56) References Cited

U.S. PATENT DOCUMENTS

| | | | |
|---|---|---|---|
| 8,785,909 B2* | 7/2014 | Radosavljevic | H01L 29/0665 257/24 |
| 9,287,360 B1* | 3/2016 | Basu | H01L 29/0673 |
| 9,496,263 B1* | 11/2016 | Ando | H01L 27/0922 |
| 2006/0076625 A1 | 4/2006 | Lee et al. | |
| 2006/0289761 A1* | 12/2006 | Nabet | H01L 31/108 250/336.1 |
| 2007/0235763 A1 | 10/2007 | Doyle et al. | |
| 2008/0237575 A1* | 10/2008 | Jin | B82Y 10/00 257/19 |
| 2010/0207208 A1* | 8/2010 | Bedell | B82Y 10/00 257/346 |
| 2011/0018065 A1* | 1/2011 | Curatola | B82Y 10/00 257/368 |
| 2011/0049474 A1* | 3/2011 | Bjoerk | B82Y 10/00 257/24 |
| 2011/0049476 A1* | 3/2011 | Bjoerk | H01L 29/7391 257/24 |
| 2011/0140171 A1 | 6/2011 | Pillarisetty et al. | |
| 2011/0147697 A1* | 6/2011 | Shah | B82Y 10/00 257/9 |
| 2011/0156004 A1* | 6/2011 | Radosavljevic | B82Y 10/00 257/24 |
| 2012/0007051 A1* | 1/2012 | Bangsaruntip | B82Y 10/00 257/24 |
| 2012/0025313 A1 | 2/2012 | Chang et al. | |
| 2012/0138888 A1* | 6/2012 | Chang | H01L 27/1203 257/9 |
| 2013/0032783 A1 | 2/2013 | Pillarisetty et al. | |
| 2013/0228751 A1* | 9/2013 | Gotsmann | B82Y 10/00 257/24 |
| 2013/0279145 A1* | 10/2013 | Then | H01L 29/66431 361/820 |
| 2014/0001520 A1* | 1/2014 | Glass | H01L 29/66439 257/288 |
| 2014/0042386 A1* | 2/2014 | Cea | H01L 29/42392 257/9 |
| 2014/0084239 A1* | 3/2014 | Radosavljevic | H01L 29/0665 257/12 |
| 2014/0091279 A1* | 4/2014 | Kachian | B82Y 10/00 257/27 |
| 2014/0175379 A1* | 6/2014 | Chu-Kung | H01L 29/267 257/20 |
| 2014/0197377 A1* | 7/2014 | Kim | H01L 27/092 257/29 |
| 2014/0209865 A1* | 7/2014 | Pillarisetty | H01L 29/42392 257/29 |
| 2014/0353574 A1* | 12/2014 | Li | H01L 29/0673 257/9 |
| 2015/0179755 A1* | 6/2015 | Rooyackers | H01L 29/42392 257/24 |
| 2016/0204246 A1* | 7/2016 | Pillarisetty | H01L 29/267 257/401 |
| 2017/0141112 A1* | 5/2017 | Ching | H01L 27/0924 |
| 2017/0194213 A1* | 7/2017 | Ching | H01L 21/823821 |
| 2019/0013395 A1* | 1/2019 | Witters | H01L 29/66439 |
| 2019/0067456 A1* | 2/2019 | Wong | H01L 29/66795 |

FOREIGN PATENT DOCUMENTS

| | | |
|---|---|---|
| WO | WO-2013095377 | 6/2013 |
| WO | WO 2013095650 | 6/2013 |

OTHER PUBLICATIONS

Intel Corporation, "International Search Report and Written Opinion", PCT/US2103/062477, (Jun. 23, 2014).
Intel Corporation, "Office Action", Taiwan Application No. 103132062, (Aug. 7, 2015).
Intel Corporation, "International Preliminary Report on Patentability", PCT/US2103/062477, (Apr. 7, 2016).
Intel Corporation, "Office action with search report", TW Application No. 105105468, (Aug. 9, 2016).
Office Action for Korean Patent Application No. 10-2016-7003458, dated Sep. 11, 2019, 8 pgs.
Notice of Allowance for Taiwan Patent Application No. 103132062, dated Jan. 21, 2016, 2 pages.
Notice of Allowance for Taiwan Patent Application No. 105105468, dated Jan. 19, 2017, 2 pages.
Office Action for Chinese Patent Application No. 201380079216.5, dated Jul. 28, 2018, 6 pages.
Search Report for European Patent Application No. 13894331.1, dated May 10, 2017, 8 pages.
Notice of Allowance for Korean Patent Application No. 10-2016-7003458, dated Jan. 28, 2020, 8 pgs.
Office Action from Malaysian Patent Application No. PI2016700627, dated Apr. 20, 2020, 3pgs.

* cited by examiner

CLADDING LAYER EPITAXY VIA TEMPLATE ENGINEERING FOR HETEROGENEOUS INTEGRATION ON SILICON

CROSS-REFERENCE TO RELATED APPLICATION

This patent application is a U.S. National Phase Application under 35 U.S.C. § 371 of International Application No. PCT/US2013/062477, filed Sep. 27, 2013, entitled IMPROVED CLADDING LAYER EPITAXY VIA TEMPLATE ENGINEERING FOR HETEROGENEOUS INTEGRATION ON SILICON.

TECHNICAL FIELD

Semiconductor devices including non-planar semiconductor devices having channel regions with low band-gap cladding layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed from group III-V compound semiconductor material systems offer exceptionally high carrier mobility in the transistor channels due to low effective mass along with reduced impurity scattering. Group III and group V refer to a location of the elements of the semiconductor material in groups 13-15 of the Periodic Table of the Elements (formerly groups III-V). Such devices provide high drive current performance and appear promising for future low power, high speed logic applications.

DESCRIPTION OF THE EMBODIMENTS

One or more embodiments described herein are directed to a non-planar semiconductor device having a channel region including a low band-gap cladding material. In one such embodiment, a gate stack of the device surrounds a channel region (such as a tri-gate or fin-fet device).

One of the main issues facing integration of different epitaxial materials (such as III-V compound materials or germanium (Ge)) in the transistor channel is lattice mismatch between those materials and silicon, and an ability to inhibit defect formation during an epitaxial process. Creation of defects in III-V compound materials and Ge will negatively impact electrical performance of these materials and erase the advantages such materials demonstrate on native (lattice matched) substrates.

FIGS. 1-7 describe a process of forming a semiconductor device. In one embodiment, the device is a three-dimensional metal oxide semiconductor field effect transistor (MOSFET) and is an isolated device or is one device in a plurality of nested devices. As will be appreciated, for a typical integrated circuit, both N- and P-channel transistors may be fabricated on a single substrate to form a complimentary metal oxide semiconductor (CMOS) integrated circuit. Furthermore, additional interconnect may be fabricated in order to integrate such devices into an integrated circuit.

Figure 1:
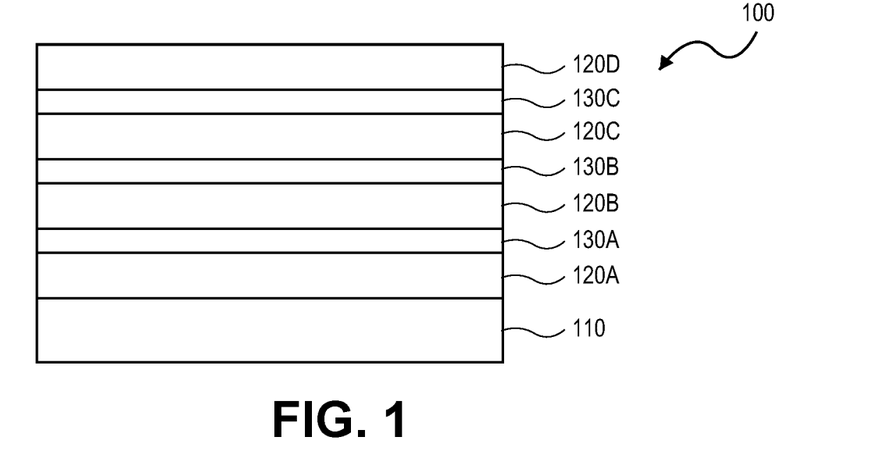
FIG. 1 shows a side view of a portion of a semiconductor substrate, such as a portion of a wafer.

FIG. 1 shows a side view of a portion of a semiconductor substrate, such as a portion of a wafer. Substrate 110, in one embodiment, is silicon. In another embodiment, substrate 110 is a silicon on insulator substrate. Overlying substrate 110, FIG. 1 shows alternating epitaxial layers of silicon and a sacrificial material such as silicon germanium. Epitaxial layers may be formed by blanket alternate deposition on substrate 110. FIG. 1 shows silicon germanium layer 120A, silicon germanium layer 120B, silicon germanium layer 120C and silicon germanium layer 120D. Disposed between the silicon germanium layers are silicon layer 130A, silicon layer 130B and silicon layer 130C, respectively.

Figure 2:
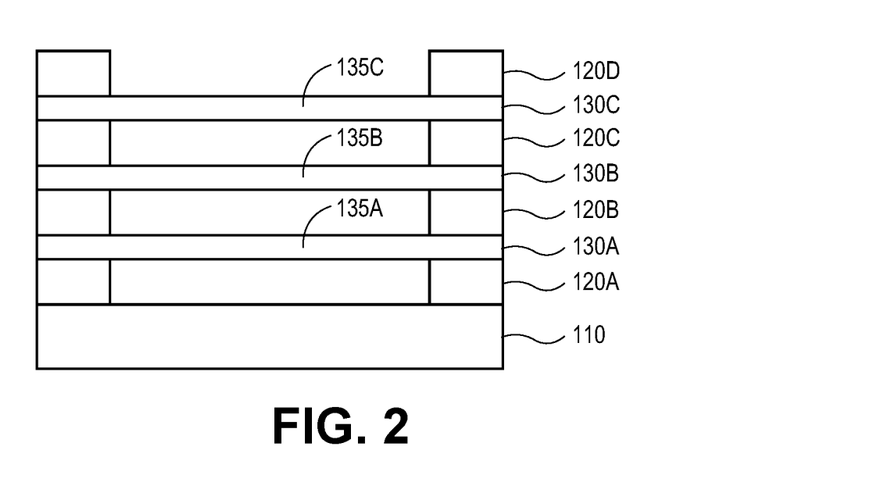
FIG. 2 shows the structure of FIG. 1 following the patterning of the layers to form nanowires of the silicon layers.

FIG. 2 shows the structure of FIG. 1 following the patterning of the layers to form nanowires of the silicon layers. FIG. 2 also shows the structure following the removal of the sacrificial material to leave nanowire 135A of silicon layer 130A; nanowire 135B of silicon layer 130B; and nanowire 135C of silicon layer 130C suspended in different planes on and over the substrate. A sacrificial material such as silicon germanium, may be selectively removed with respect to silicon with an oxidizing wet etch, e.g., citric acid, nitric acid or hydrogen fluoride. As viewed, FIG. 2 shows nanowire 135A suspended in a plane directly above substrate 110 (as viewed); nanowire 135B suspended in a plane directly over nanowire 135A; and nanowire 135C suspended in a plane directly over nanowire 135B (as viewed). Portions of the sacrificial material (e.g., silicon germanium) may remain to suspend the nanowires. In one embodiment, nanowires 135A-135C having a thickness dimension to permit compliance of a material of the nanowires with a lattice structure of a cladding material introduced thereon. A representative thickness is on the order of five nanometers or less (e.g., two nanometers to three nanometers).

Figure 3:
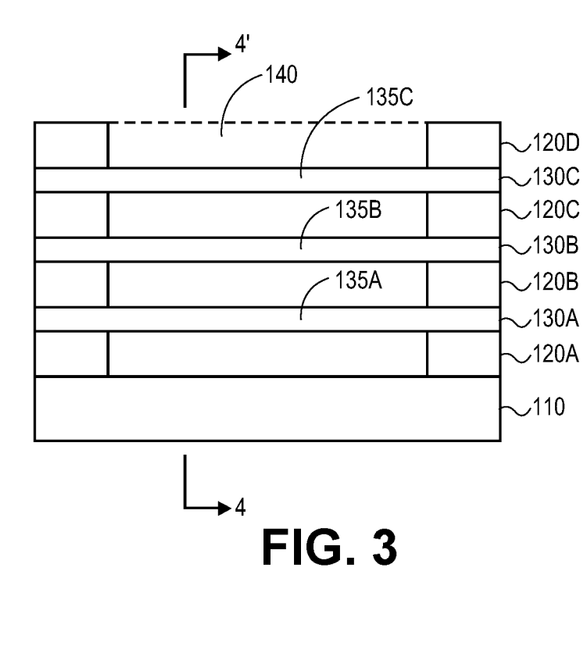
FIG. 3 shows the structure of FIG. 2 following the forming of a cladding material on each of the metal layers.

FIG. 3 shows the structure of FIG. 2 following the forming of a cladding material on each of the metal layers. In one embodiment, cladding material 140 is a material having a lower band gap than a band gap of a material of the nanowires. Where nanowires 135A-135C are silicon, cladding material has a lower band gap than silicon. One example is a cladding material of germanium. In another embodiment, cladding material 140 is a group III-V compound semiconductor (group III-V representing groups in the Periodic Table of the Elements). In one embodiment, cladding material 140 is epitaxially grown on each nanowire. The cladding material surrounds the nanowire and the growth is continued until the material coalesces to form one three-dimensional body of cladding material having suspended nanowires 135A-135C disposed therein on substrate 110.

Figures 4, 5:
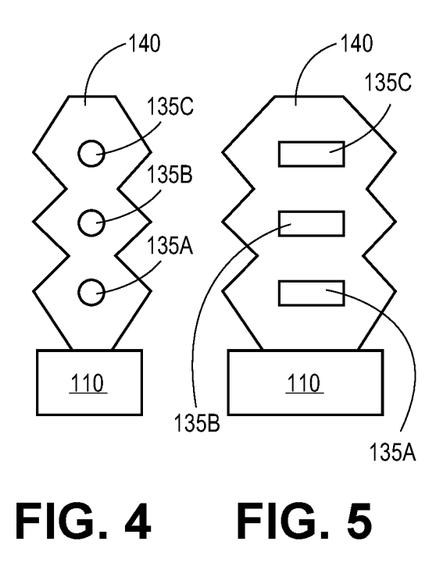
FIG. 4 shows a side view of a portion of the structure through line 4-4'.
FIG. 5 shows another embodiment of a cross-section of a portion of the structure through line 4-4' to illustrate a nanowire having a different cross-section.

FIG. 4 shows a side view of a portion of structure 100 through line 4-4' of FIG. 3. In this view, the coalescing or merging of cladding material 140 epitaxially grown on each nanowire (nanowires 135A-135C). In one embodiment, cladding material 140 is coalesced or merged into one body as illustrated. Previous approaches involving introducing (e.g., growing) cladding material on nanowires have focused on the cladding material taking the same shape as a shape of the nanowire core (e.g., a nanowire having a generally circular cross-section would have a circular or ring-shaped cladding layer surrounding it and a fin core would have a fin-shaped cladding layer surrounding it). As described herein, a shape of the cladding material need not be the same as a shape of the core (nanowire) and, in one embodiment, a cross-sectional shape of the cladding material is different than a cross-sectional shape of the core. One advantage of a cladding material that is not confined to a shape of a core is that a selection of a shape of a core is generally not constrained. In general, a nanowire of a generally circular-shaped cross-sectional core allows the growth of a less defective cladding layer compared to a fin-shaped core due to increased substrate compliance and increased free surface relaxation. However, a ring-shaped cladding layer has less volume and can carry less current than cladding layers of other shapes (e.g., a fin-shaped cladding layer). For current density/transistor performance purposes, it is therefore generally preferable to use a fin-like shape for a core to gain the larger volume and current capacity of a corresponding cladding layer. By not constraining a shape of a cladding layer to a shape of core, the benefits of a generally circular cross-sectional nanowire core and a large volume and current capacity cladding layer can be realized. Growth on such a nanowire core provides lower defect density, and since the cladding layers are allowed to coalesce or merge, a larger device volume is achieved that enables higher performance. Another traditional disadvantage of multiple nanowires stacked on top of each other is that it gets harder to move current in/out of the bottom-most nanowires (due to increased resistance of that current path). Allowing the cladding layers to coalesce or merge essentially creates a single monolithic transistor, which has only one contact, much like a fin.

It is appreciated that the sidewalls of the coalesced body may have a variety of shapes depending on the growth pattern of the cladding material 140 on the nanowires. FIG. 4 shows an embodiment where cladding material grows approximately uniformly on each nanowire. FIG. 4 also shows nanowires 135A-135C having a circular cross-section. FIG. 5 shows another embodiment of a cross-section of a portion of structure 100 through line 4-4' to illustrate a nanowire having a different cross-section. In this embodiment, nanowires 130A-130C are ribbons or fins (having a rectangular cross-section). As used herein, unless specifically described as having a generally circular cross-section, the word "nanowire" is used to describe a nanostructure having a cross-section of a variety of shapes (wire, fin or ribbon, etc.).

Figure 6:
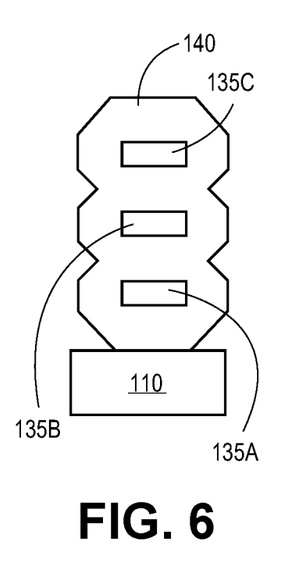
FIG. 6 shows the structure of FIG. 5 following the optional etching of the sidewalls of the cladding material.

FIG. 6 shows the structure of FIG. 5 following an optional process to flatten or make less jagged or pronounced the sidewalls of cladding material 140. One way to do such processing is by a collimated (vertical) dry etch.

Figure 7:
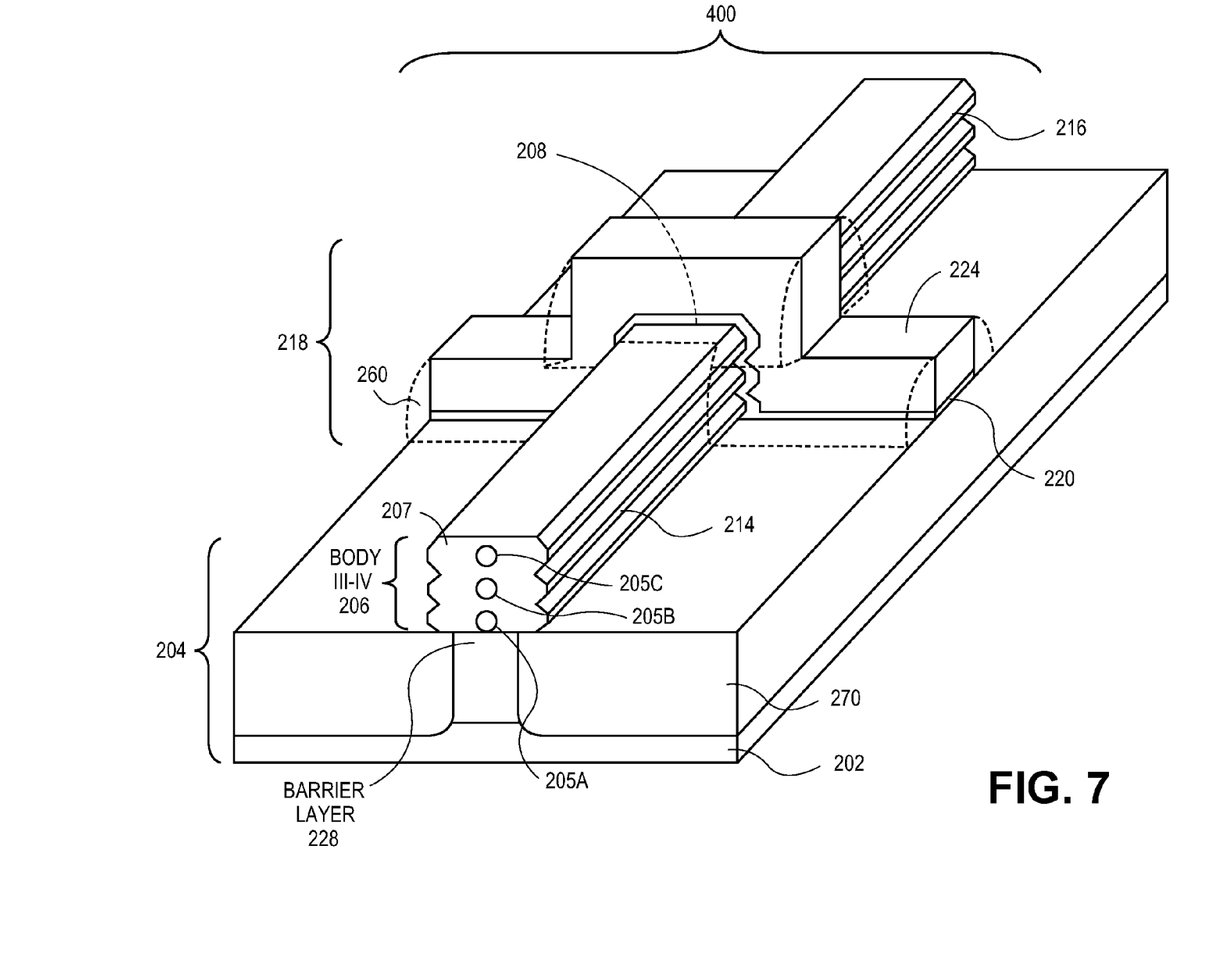
FIG. 7 shows a perspective top view of a non-planar semiconductor device having a heterostructure.

Structure 100 shown in FIGS. 3-5 is a three-dimensional body that may form a portion of a heterostructure, the three-dimensional body including cladding material 140 having a band gap that is lower than a band gap of nanowires disposed therein and therethrough. In one embodiment, such a three-dimensional body may be used as part of the three-dimensional MOSFET device, specifically used as a channel region and junction regions (e.g., source and drain regions) of such a device. FIG. 7 shows a perspective top view of a non-planar semiconductor device having a three-dimensional body formed on (e.g., above) a semiconductor substrate such as described with reference to FIGS. 1-5.

Referring to FIG. 7, semiconductor device 200 includes heterostructure 204 disposed above substrate 202. In this embodiment, heterostructure 204 includes barrier layer 228. Three-dimensional body 206 with channel region 208 is disposed above barrier layer 228. Three-dimensional body 206 includes nanowires 205A, 205B and 205C and cladding material 207. In one embodiment, cladding material 207 has a band gap that is less than a band gap of a material of nanowires 205A-205C. Gate stack 218 is disposed around at least a portion of channel region 208. Gate stack 218 includes gate electrode 224 and gate dielectric layer 220. The gate stack may further include dielectric spacers 260.

Source and drain regions 214/216 may be formed in or on portions of three-dimensional body 206 not surrounded by gate stack 218 (e.g., on opposite sides of channel region 208). Furthermore, a top barrier layer may be included in those regions as well. Also, isolation regions 270 may be included. Although depicted in FIG. 7 as being somewhat aligned with a bottom of barrier layer 228, it is to be understood that the depth of isolation regions 270 may vary. Also, although depicted in FIG. 7 as being somewhat aligned with a top of barrier layer 228, it is to be understood that the height of isolation regions 270 may vary.

Substrate 202 may be composed of a material suitable for semiconductor device fabrication. In one embodiment, substrate 202 is a bulk substrate composed of a single crystal of a material which may include, but is not limited to, silicon, germanium, silicon-germanium or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 202 may further include dopant impurity atoms.

Although not shown, heterostructure 204 may include a stack of one or more crystalline semiconductor layers, such as a compositional buffer layer with barrier layer 228 disposed thereon. A representative compositional buffer layer may be composed of a crystalline material suitable to provide a specific lattice structure onto which a barrier layer may be formed with negligible dislocations. For example, in accordance with an embodiment, the compositional buffer layer is used to change, by a gradient of lattice constants, the exposed growth surface of semiconductor heterostructure 204 from the lattice structure of substrate 202 to one that is more compatible for epitaxial growth of high quality, low defect layers thereon. In one embodiment, the compositional buffer layer acts to provide a more suitable lattice constant for epitaxial growth instead of an incompatible lattice constant of substrate 202. In an embodiment, substrate 202 is composed of single-crystal silicon and the compositional buffer layer grades to barrier layer 228 composed of a layer of InAlAs having a thickness of approximately one micron. In an alternative embodiment, the compositional buffer layer is omitted because the lattice constant of substrate 202 is suitable for the growth of barrier layer 228 for a semiconductor device.

Barrier layer 228 may be composed of a material suitable to confine a wave function in a channel region formed thereon. In accordance with an embodiment, barrier layer 228 has a lattice constant suitably matched to the top lattice constant of the compositional buffer layer, e.g., the lattice constants are similar enough that dislocation formation in barrier layer 228 is negligible. In one embodiment, barrier layer 228 is composed of a layer of approximately $In_{0.65}Al_{0.35}As$ having a thickness of approximately 10 nanometers. In a specific embodiment, barrier layer 228 is composed of the layer of approximately $In_{0.65}Al_{0.35}As$ is used for quantum confinement in an N-type semiconductor device. In another embodiment, barrier layer 228 is composed of a layer of approximately $In_{0.65}Al_{0.35}Sb$ having a thickness of approximately 10 nanometers. In a specific embodiment, barrier layer 228 composed of the layer of approximately $In_{0.65}Al_{0.35}Sb$ is used for quantum confinement in a P-type semiconductor device.

In an embodiment, three-dimensional body 206 includes nanowires 205A-205C having a higher band gap than cladding material 207. The choice of cladding material 207/nanowires 205A-205C combinations is in principle plentiful. For example, pairs that are lattice matched (or nearly lattice matched) in the group III-V material regime, including InGaAs/InP, GaAs/AlGaAs, InSb/AlInSb, may be used. Although many embodiments described herein are directed to group III-V compound material channel regions, other embodiments may include the use of Si/SiGe/Ge. For example, a low band gap Ge-rich cladding material may be used together with high band gap Si-rich nanowires. In general, cladding material 207 may be composed of a material suitable to propagate a wave function with low resistance. In an embodiment, cladding material 207 is composed of groups III (e.g. boron, aluminum, gallium or indium) and V (e.g. nitrogen, phosphorous, arsenic or antimony) elements. In one embodiment, cladding material 207 is composed of InAs or InSb. In the case of a group III-V compound material heterostructure, inner region 205 may be composed of the same material as barrier layer 228 in the heterostructure.

Cladding material 207 may have a thickness suitable to propagate a substantial portion of a wave function, e.g. suitable to inhibit a significant portion of the wave function from entering nanowires 205A-205C. In an embodiment, cladding material 207 has a thickness approximately in the range of 1 nm to 10 nm.

Source and drain material regions, e.g., formed at locations 214 and 216, may be doped group III-V compound material regions.

In an embodiment, referring again to FIG. 7, gate electrode 224 of gate electrode stack 218 is composed of a metal gate and gate dielectric layer 220 is composed of a material having a dielectric constant greater than a dielectric constant of silicon dioxide (a high-K material). For example, in one embodiment, gate dielectric layer 220 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 220 may include a layer of native oxide formed from the top few layers of semiconductor body 206. In an embodiment, gate dielectric layer 220 is composed of a top high-k portion and a lower portion composed of an oxide of a semiconductor material. In one embodiment, gate dielectric layer 220 is composed of a top portion of hafnium oxide and a bottom portion of silicon dioxide or silicon oxy-nitride.

In one embodiment, gate electrode 224 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, gate electrode 224 is composed of a non-workfunction-setting fill material formed above a metal workfunction-setting layer.

Figure 8:
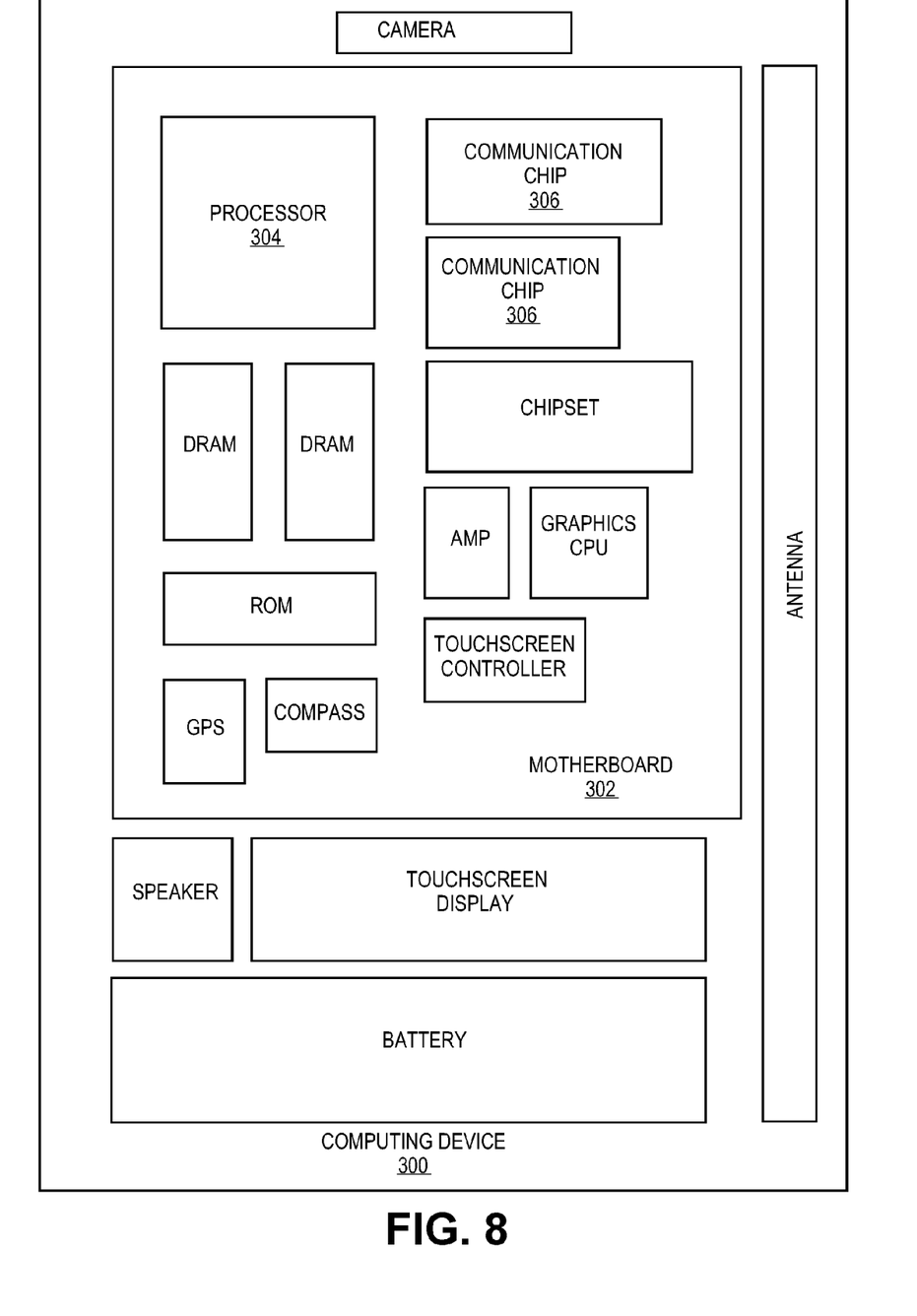
FIG. 8 illustrates computing device in accordance with one implementation of the invention.

FIG. 8 illustrates a computing device 300 in accordance with one implementation. Computing device 300 houses board 302. Board 302 may include a number of components, including but not limited to processor 304 and at least one communication chip 306. Processor 304 is physically and electrically coupled to board 302. In some implementations at least one communication chip 306 is also physically and electrically coupled to board 302. In further implementations, communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, first communication chip 306 may be dedicated to shorter range wireless communications such as Wi-Fi and Bluetooth and second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations of the invention, the integrated circuit die of the processor includes one or more devices, such as MOSFET transistors built in accordance with implementations of the invention. The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation of the invention, the integrated circuit die of the communication chip includes one or more devices, such as MOSFET transistors built in accordance with implementations of the invention.

In further implementations, another component housed within computing device 300 may contain an integrated circuit die that includes one or more devices, such as MOSFET transistors built in accordance with implementations of the invention.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

EXAMPLES

The following examples pertain to embodiments.

Example 1 is an apparatus (e.g., a semiconductor apparatus) including a three-dimensional semiconductor body comprising a channel region and junction regions disposed on opposite sides of the channel region, the three-dimensional semiconductor body including a first material comprising a first band gap; and a plurality of nanowires comprising a second material comprising a second band gap different than the first band gap, the plurality of nanowires disposed in separate planes extending through the first material so that the first material surrounds each of the plurality of nanowires; and a gate stack disposed on the channel region, the gate stack comprising a gate electrode disposed on a gate dielectric. A representative semiconductor apparatus is a three-dimensional MOSFET.

In Example 2, the band gap of the first material in the apparatus of Example 1 is less than the band gap of the second material.

In Example 3, the first material in the apparatus of Example 1 includes a group III and group V compound material.

In Example 4, the first material in the apparatus of Example 1 is selected from the group consisting of InGaAs/InP, GaAs/AlGaAs and InSb/AlInSb.

In Example 5, the first material in the apparatus of Example 1 includes germanium and the second material comprises silicon.

In Example 6, the cross-sectional shape of the first material in the apparatus of Example 1 is different than a cross-sectional shape of the plurality of nanowires.

In Example 7, the three-dimensional semiconductor body of Example 1 is disposed on a semiconductor substrate.

Example 8 is an apparatus (e.g., a semiconductor apparatus) including a fin comprising a plurality of nanowires arranged in a stacked arrangement on a substrate, each nanowire including a material having a first band gap and a cladding material comprising a second band gap surrounding each of the plurality of nanowires and coalesced into one body; a gate stack disposed on a channel region of the fin, the gate stack including a gate dielectric and a gate electrode; and a source region and a drain each defined in the fin on opposite sides of the channel region. A representative semiconductor apparatus is a three-dimensional MOSFET.

In Example 9, the band gap of the cladding material in the apparatus of Example 8 is less than the band gap of a material of the nanowires.

In Example 10, the cladding material in the apparatus of Example 8 includes a group III and group V compound material.

In Example 11, the cladding material in the apparatus of Example 8 includes at least one of InGaAs/InP, GaAs/AlGaAs and InSb/AlInSb.

In Example 12, the cladding material in the apparatus of Example 8 includes germanium and a material of the nanowires comprises silicon.

In Example 13, the cross-sectional shape of the first material in the apparatus of Example 8 is different than a cross-sectional shape of the plurality of nanowires.

In Example 14, the three-dimensional semiconductor body in the apparatus of Example 8 is disposed on a semiconductor substrate.

Example 15 is a method of manufacturing a semiconductor device such as a three-dimensional MOSFET including forming a plurality of nanowires in separate planes above a substrate, each of the plurality of nanowires comprising a material including a first band gap; individually forming a cladding material around each of the plurality of nanowires, the cladding material including a second band gap; coalescing the cladding material; and disposing a gate stack on the cladding material, the gate stack including a dielectric material and a gate electrode.

In Example 16, the band gap of the material of the plurality of nanowires in the method of Example 11 is greater than a band gap of the cladding material.

In Example 17, the cladding material in the method of Example 11 includes a group III and group V compound material.

In Example 18, forming the cladding material in the method of Example 11 includes epitaxially growing the cladding material.

In Example 19, the material of the plurality of nanowires in the method of Example 11 includes silicon and the cladding material comprises germanium.

In Example 20, an apparatus such as a three-dimensional or non-planar transistor structure (e.g., a three-dimensional MOSFET) is made by any of the methods of Examples 15-19.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A semiconductor apparatus comprising:
   a three-dimensional semiconductor body comprising a channel region and junction regions disposed on opposite sides of the channel region, the three-dimensional semiconductor body comprising:
   a first material comprising a first band gap; and
   a plurality of nanowires comprising a second material comprising a second band gap different than the first band gap, wherein the second material comprises silicon, the plurality of nanowires disposed in separate planes extending through the first material so that the first material surrounds each of the plurality of nanowires and is continuous between each of the plurality of nanowires in the channel region, wherein the first material comprises a group III and group V compound material; and
   a gate stack disposed on the channel region, the gate stack comprising a gate electrode disposed on a gate dielectric.

2. The apparatus of claim 1, wherein the band gap of the first material is less than the band gap of the second material.

3. The apparatus of claim 1, wherein the first material is selected from the group consisting of InGaAs/InP, GaAs/AlGaAs and InSb/AlInSb.

4. The apparatus of claim 1, wherein a cross-sectional shape of the first material is different than a cross-sectional shape of the plurality of nanowires.

5. The apparatus of claim 1, wherein the three-dimensional semiconductor body is disposed on a semiconductor substrate.

6. A semiconductor apparatus comprising:
   a fin comprising a plurality of nanowires arranged in a stacked arrangement on a substrate, each nanowire comprising a material having a first band gap and a cladding material comprising a second band gap surrounding each of the plurality of nanowires and coalesced into one body which is continuous between each of the plurality of nanowires in the channel region, wherein the cladding material comprises a group III and group V compound material;
   a gate stack disposed on a channel region of the fin, the gate stack comprising a gate dielectric and a gate electrode; and
   a source region and a drain each defined in the fin on opposite sides of the channel region.

7. The apparatus of claim 6, wherein the band gap of the cladding material is less than the band gap of a material of the nanowires.

8. The apparatus of claim 6, wherein the cladding material is selected from the group consisting of InGaAs/InP, GaAs/AlGaAs and InSb/AlInSb.

9. The apparatus of claim 6, wherein a cross-sectional shape of the first cladding material is different than a cross-sectional shape of the plurality of nanowires.

10. The apparatus of claim 6, wherein the fin three-dimensional semiconductor body is disposed on a semiconductor substrate.

* * * * *